(12) United States Patent
Correale, Jr. et al.

(10) Patent No.: US 7,119,578 B2
(45) Date of Patent: Oct. 10, 2006

(54) SINGLE SUPPLY LEVEL CONVERTER

(75) Inventors: Anthony Correale, Jr., Raleigh, NC (US); Rajiv V. Joshi, Yorktown Heights, NY (US); David S. Kung, Chappaqua, NY (US); Zhigang Pan, Austin, TX (US); Ruchir Puri, Peekskill, NY (US)

(73) Assignee: International Business Machines Corp., Armonk, NY (US)

( * ) Notice: Subject to any disclaimer, the term of this patent is extended or adjusted under 35 U.S.C. 154(b) by 46 days.

(21) Appl. No.: 10/720,466

(22) Filed: Nov. 24, 2003

(65) Prior Publication Data

US 2005/0110519 A1 May 26, 2005

(51) Int. Cl.
*H03K 19/0175* (2006.01)
*H03K 19/094* (2006.01)

(52) U.S. Cl. .............................. 326/81; 326/68; 327/333
(58) Field of Classification Search .................. 326/68, 326/70–72, 76, 81, 83, 86; 327/333
See application file for complete search history.

(56) References Cited

U.S. PATENT DOCUMENTS

| | | | | |
|---|---|---|---|---|
| 4,786,830 A | * | 11/1988 | Foss | 326/71 |
| 5,304,867 A | * | 4/1994 | Morris | 326/71 |
| 5,594,368 A | | 1/1997 | Usami | |
| 5,818,256 A | | 10/1998 | Usami | |

FOREIGN PATENT DOCUMENTS

EP 125733 A1 * 11/1984

OTHER PUBLICATIONS

James Kao, "Dual Threshold Voltage Domino Logic", Proceedings of the European Solid-State Circuits Conference, Sep. 1999, pp. 118-121.*
Lackey et al., Managing power and performance for System-on-Chip designs using Voltage Islands, Proceedings of the 2002 IEEE/ACM international conference on Computer-aided design, Nov. 11, 2002, pp. 195-202.
Usami et al., Clustered Voltage Scaling Techniques for Low-Power Design, International Symposium on Low-Power Electronic Design, Apr. 1, 1995, pp. 3-8, Publisher: ACM Press.
Usami et al., Automated Low-Power Technique Exploiting Multiple Supply Voltages Applied to a Media Processor, IEEE Journal of Solid-State Circuits, Mar. 1, 1998, pp. 463-472, vol. 33, No. 3.
Yeh et al., Layout Techniques Supporting the Use of Dual Supply Voltages for Cell-Based Designs, Proc. ACM/IEEE Design Auto. Conf., Jun. 1, 1999, pp. 62-67.

* cited by examiner

*Primary Examiner*—Daniel Chang
(74) *Attorney, Agent, or Firm*—Law Office of Charles W. Peterson, Jr.; Louis J. Percello, Esq.; Satheesh K. Karra, Esq.

(57) ABSTRACT

A level converter for interfacing two circuits supplied by different supply voltages, and integrated circuit including the level converter interfacing circuit in two different voltage islands. A first buffer is supplied by a virtual supply and receives an input signal from a lower voltage circuit. The first buffer drives a second buffer, which is supplied by a higher supply voltage. An output from the second buffer switches a supply select to selectively pass the higher supply voltage or a reduced supply voltage to the first buffer.

12 Claims, 7 Drawing Sheets

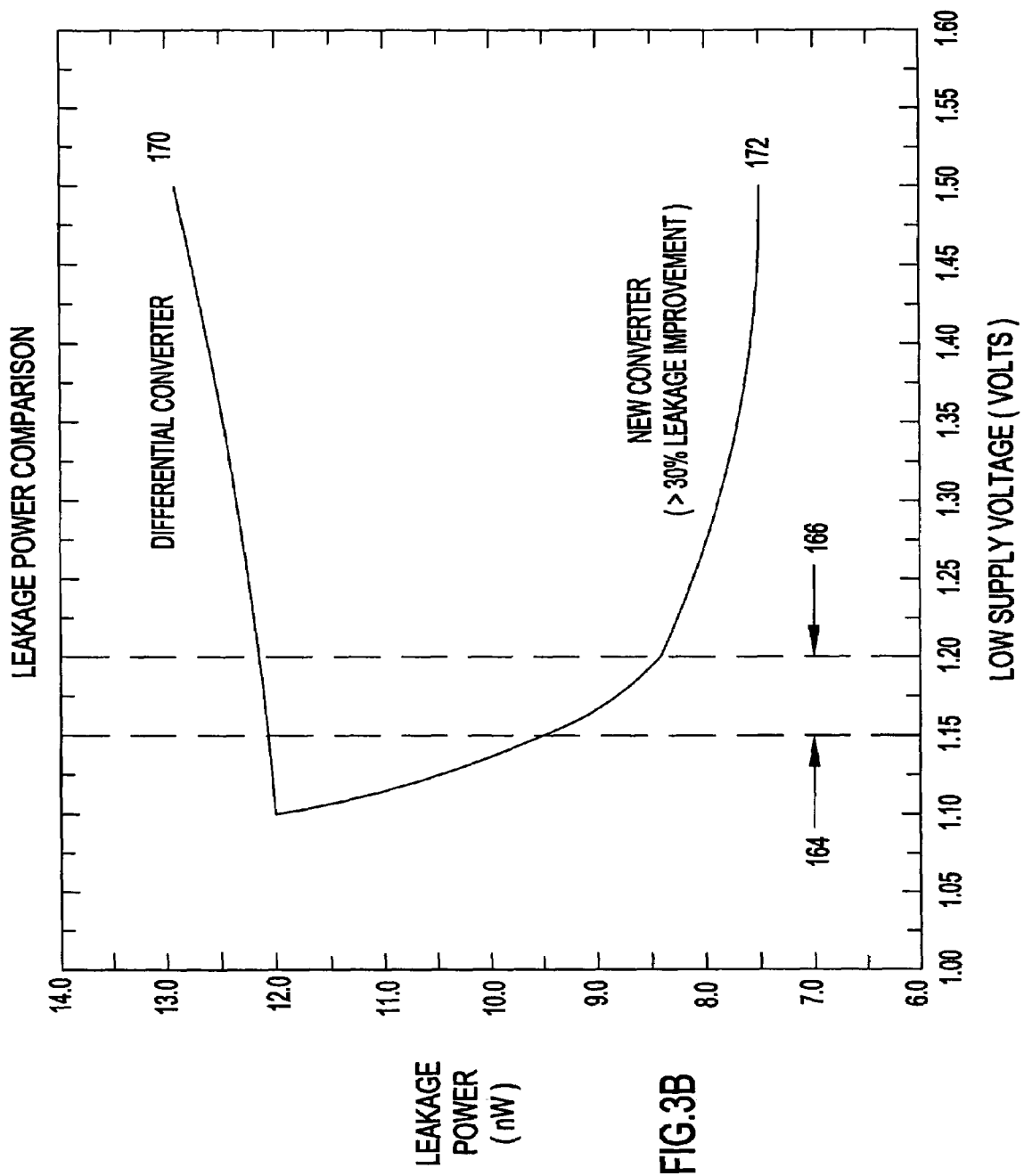

SINGLE SUPPLY LEVEL CONVERTER

CROSS REFERENCE TO RELATED APPLICATION

The present invention is related to U.S. application Ser. No. 10/720,464 entitled "MULTIPLE VOLTAGE INTEGRATED CIRCUIT AND DESIGN METHOD THEREFOR" to Anthony Correale Jr. et al., U.S. application Ser. No. 10/720,562 entitled "METHOD AND PROGRAM PRODUCT OF LEVEL CONVERTER OPTIMIZATION" to Anthony Correale Jr. et al., both filed coincident herewith and to U.S. application Ser. No. 10/387,728 entitled "VOLTAGE ISLAND CIRCUIT PLACEMENT" to Anthony Correale Jr., filed Mar. 13, 2003, all assigned to the assignee of the present invention.

BACKGROUND OF THE INVENTION

1. Field of the Invention

The present invention is related to integrated circuit (IC) design and more particularly, to optimizing standard cell design configurations.

2. Background Description

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, must be achieved without degrading performance below acceptable levels.

Consequently, power consumption has been a major design consideration for designing very large scale integrated circuits (VLSI) such as high performance microprocessors. In particular, increasing power requirements run counter to the low end design goal of longer battery life. Since chip power is directly proportion to the square of supply voltage ($V_{dd}$), reducing supply voltage is one of the most effective ways to reduce the power consumption, both active and standby (leakage) power, which is becoming more and more of a problem as technology features scale into nanometer (nm) dimension range.

While reducing supply voltage is attractive to reduce the power consumption, reducing $V_{dd}$ increases transistor and gate delay. Thus, for a design that is performance constrained, the supply voltage may not be lowered too much and, it is usually determined by the most timing critical paths. However, it is often the case that most cells in a chip are timing non-critical. If those timing non-critical cells are properly selected to be on lower supply voltage(s), significant power saving may be achieved without degrading the overall circuit performance. So, One approach to reducing power is to use multiple supply voltages, each supplying different circuit blocks or voltage islands. Each voltage island runs at its minimum necessary supply voltage. Level converters are included, at least to interface lower supply voltage islands with higher supply voltage islands. The traditional level converter is a simple inverter between inputs to a differential amplifier and require both power supplies.

Unfortunately, level converters add to overhead, increasing chip power and each takes up space decreasing area available for other circuits. Level converter placement is normally restricted on a chip to the island boundaries between lower and higher supply voltage regions. This complicates the physical design for multiple supply voltage circuits because the level converters can only be physically placed in regions which have access to both power supplies. In addition, due to the differential nature of the traditional level converter circuits, the power consumption by the level converter circuits can significantly offset any power reduction possible realized by migrating to a multiple supply voltage design. Also, since these level converters add delay, this additional delay may prevent switching some circuits to the lower supply voltage, further offsetting power reduction that would otherwise be realized. Also, these differential level converters are not easily adaptable for other logic functions than a simple buffer or inverter, which might otherwise provide additional savings in delay and power.

Thus, there is a need for a level converter capable of interfacing voltage islands, each operating on a different supply voltage and that can operate on a single supply voltage.

SUMMARY OF THE INVENTION

It is a purpose of the invention to improve integrated circuit (IC) chip design;

It is another purpose of the invention to reduce IC chip power;

It is yet another purpose of the invention to improve flexibly placing logic of a first supply voltage with logic of other supply voltages in multi supply voltage IC chip designs;

It is yet another purpose of the invention to efficiently interface low voltage islands with high voltage islands in multi supply voltage IC chip designs;

It is yet another purpose of the invention to improve low voltage islands to high voltage island delays in multi supply voltage IC chip designs;

It is yet another purpose of the invention to reduce level converter power;

It is yet another purpose of the invention to flexibly locate level converters in multi supply voltage IC chip designs.

The present invention relates to a level converter for interfacing two circuits supplied by different supply voltages, and integrated circuit including the level converter interfacing circuits in two different voltage islands. A first buffer is supplied by a virtual supply and receives an input signal from a lower voltage circuit. The first buffer drives a second buffer, which is supplied by a higher supply voltage. An output from the second buffer switches a supply select to selectively pass the higher supply voltage or a reduced supply voltage to the first buffer.

BRIEF DESCRIPTION OF THE DRAWINGS

The foregoing and other objects, aspects and advantages will be better understood from the following detailed description of a preferred embodiment of the invention with reference to the drawings, in which:

FIGS. 3A–C show comparisons of performance and power simulation results, comparing a preferred embodiment inverter compared with a prior art multiple supply, differential level converter;

DESCRIPTION OF PREFERRED EMBODIMENTS

Figure 1A:
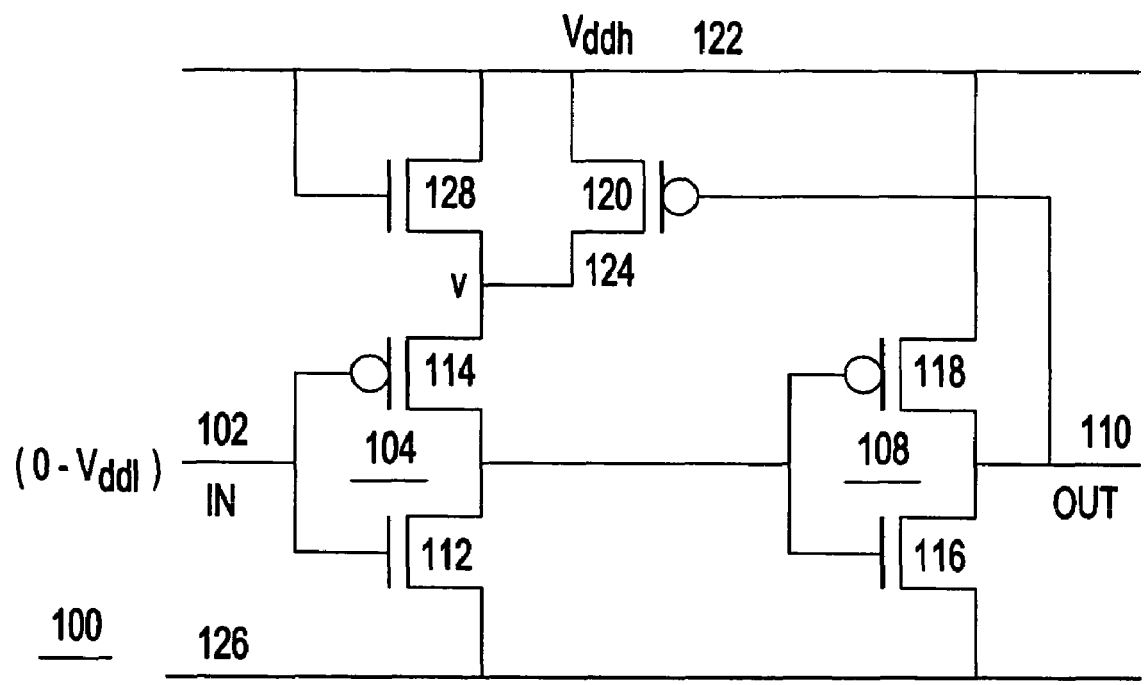
FIGS. 1A–B show examples of simple preferred embodiment single supply level converters.
Figure 1B:
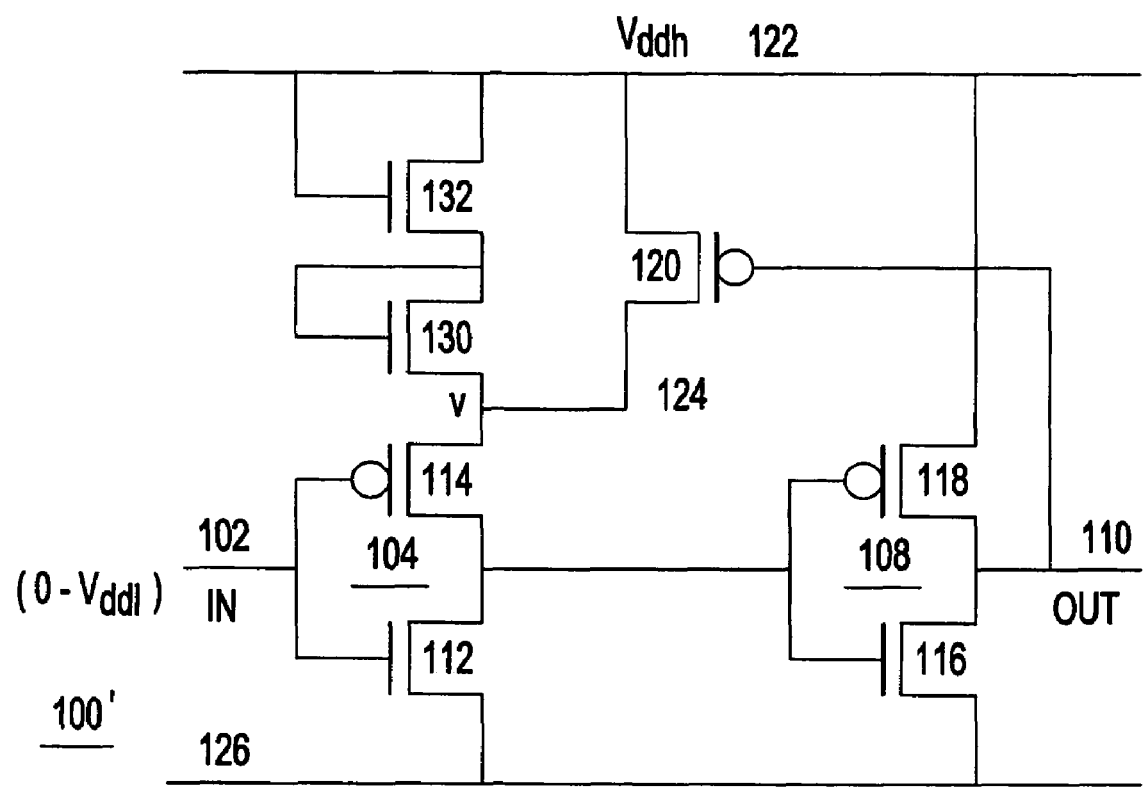

Turning now to the drawings and more particularly, FIGS. 1A–B show examples of simple single supply level converters 100, 100', receiving a low supply voltage signal at input 102 according to a preferred embodiment of the present invention. Essentially, in this example, each level converter 100, 100' is a pair of series connected buffers (inverters 104 and 108 in this example) with the output 110 of the second inverter 108 switching the supply voltage for the input inverter 104. Each input inverter 104 includes a pair of series connected complementary field effect transistors (FETs) n-type FET (NFET) 112 and p-type FET (PFET) 114. Input 102 receives a low voltage signal and drives the gates of NFET 112 and PFET 114. The second inverter 108 also includes a pair of series connected devices, NFET 116 and PFET 118, which are connected together at their drains at output 110. The drains of NFET 112 and PFET 114 are connected together forming the output of the first inverter 104, which is connected to the gates of NFET 116 and PFET 118 as the input to the second inverter 108.

A supply switching PFET 120 is series connected between a high voltage supply 122 and the source of input inverter PFET 114 at internal supply node 124. Output 110 is connected to the gate of supply switching PFET 120, selectively turning it on and off. The source of each NFET 112 and 116 is connected to a supply return 126 or ground and the source of PFET 118 is connected to high voltage supply 122. In these examples, a low supply voltage is provided at 124 by the level converter 100, 100' diode connected (gate to drain) NFET 128 and series connected diode NFETs 130, 132, respectively, which are connected between high voltage supply 122 and the drains of switching PFET 120 and input inverters 104. Thus, the threshold drop across the diode connected (gate to drain) NFET 128 or series connected diode NFETs 130, 132 provide a virtual low supply voltage to particular the input inverter 104.

For simplicity of discussion herein below and, unless indicated otherwise, logic cell and gate are used interchangeably and each is a sub-circuit of standard cell design. Further, a standard cell design is taken as having the same height, i.e., row height, for most cells. Abutting cells form circuit rows. Also, typical modem application specific integrated circuit (ASIC) and system on a chip (SOC) designs often have many proprietary macros (known in the art as intellectual property (IP) blocks) mixed with standard cells. A voltage island can be a single cell, an IP block or macro or, a continuous region of cells on the same or adjacent rows that have the same power supply voltage (referred to herein as a high voltage supply or $V_{ddh}$ and a low voltage supply or $V_{ddl}$). An output or source drives a net connecting one or more inputs or sinks to the source and a low/high voltage net connects a low/high voltage source to low/high voltage sinks. Also, although described herein in terms of two (2) supplies description, this is for example only and not intended as a limitation. A person skilled in the are would readily understand how to extended the 2 supply description to multiple supply voltages.

Continuing the description of preferred embodiment level converters 100, 100', when the input 102 is low, the output 110 is low. Switching PFET 120 is on, providing the high supply voltage to internal supply node 124. With the internal supply node 124 at the high supply voltage diode connected NFET 128 or series connected diode NFETs 130, 132 are off and, both buffers 104 and 108 are high voltage buffers and provide full level outputs to a next stage. As the input rises, inverter 104 begins to switch, which in turn switches inverter 108. When the input 102 is high, the output 110 is high and switching PFET 120 is off and diode connected NFET 128 or series connected diode NFETs 130, 132 are on, providing a virtual low supply voltage (i.e., reduced from the high supply voltage by the voltage drop across each NFET diode 128, 130, 132) to internal supply node 124.

Normally, with a low voltage input signal high at input 102, PFET 114 might not turn off or, at the very least would suffer substantial subthreshold leakage. However, with the virtual low supply voltage at internal supply node 124 the gate to source voltage ($V_{gs}$) for PFET 114 is substantially reduced and so is subthreshold leakage, if not eliminated. In particular, with the example 100' of FIG. 1B, the gate of first inverter PFET 114 may be positive with respect to its source (internal supply node 124), further driving PFET 114 out of its subthreshold leakage range. When the input switches low again, essentially, the output inverter 108 of these examples, acts as a half latch, switching in the high voltage supply to pull up the input to the output inverter 108 to avoid leakage there also. Optionally, for additional subthreshold leakage protection/reduction in output inverter 108, PFET 114 and/or supply switching PFET 120 may be a higher threshold device, if such a process option is available. Similarly, NFETs 128, 130 and 132 may be a high threshold device.

It should be noted that this virtual low supply voltage may or may not be the same as the low supply voltage provided to low supply voltage cells. Also, while typical high voltage supplies have been significantly reduced (e.g., from 1.5V to 1.2V) due to aggressive scaling, the nominal device threshold voltages have not been scaled as aggressively to prevent or at least minimize leakage power. So, it is possible to interface low voltage supply signals originating from circuits using lower supply voltages (e.g., 1.1V) with a preferred embodiment level converter without any significant additional leakage power. Also, output inverter 108, provides a preferred level converter with better drive and behaves robustly with changes in output load in contrast to the differential converter which is relatively sensitive to the load changes.

Figure 2:
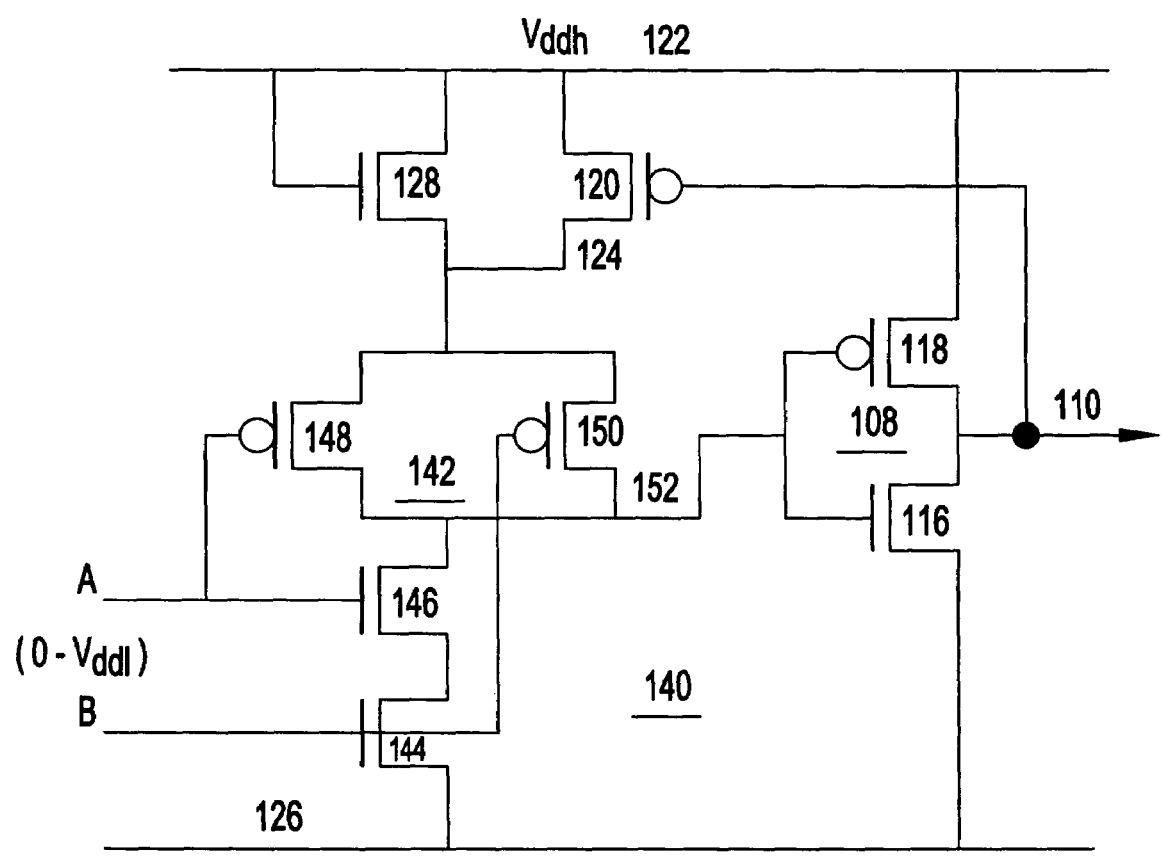
FIG. 2 shows another example of a NAND/AND level converter.

FIG. 2 shows another example of a level converter 140 providing an equivalent logic function, NAND or AND, in this example. So, in this example, instead of an input inverter, the input buffer 142 is a NAND gate with a pair of series connected NFETs 144, 146 and a corresponding pair of parallel connected PFETs 148, 150. Series connected NFETs 144 and 146 are connected between supply return 126 and NAND gate output 152. Parallel connected PFETs 148, 150 are connected between NAND gate output 152 and internal supply node 124. The second inverter 108 output 110 is an AND gate output. Optionally, NAND gate output 152 may be used as a level converter output for driving a light load or where performance allows.

Figure 3A:
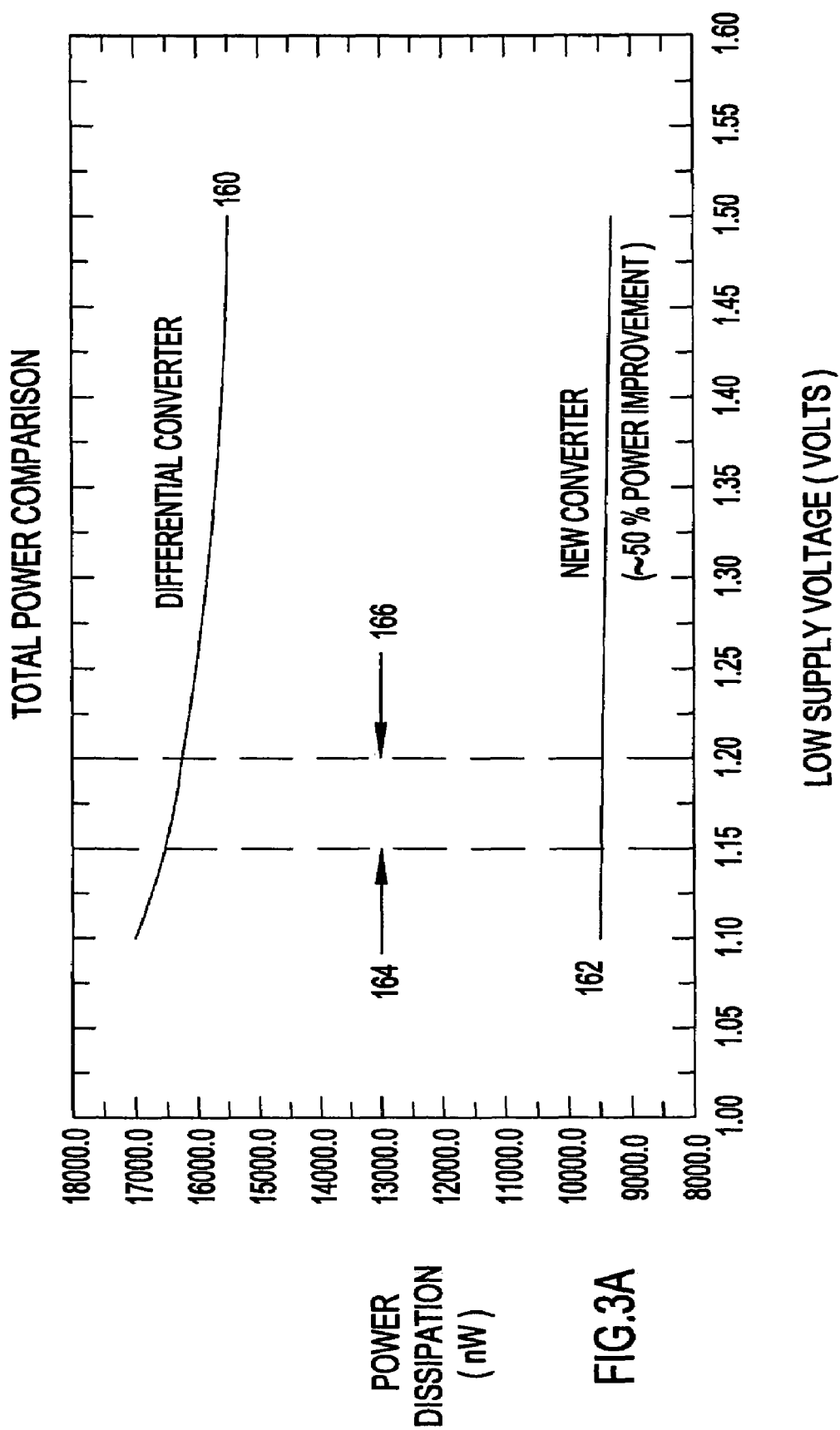
Figure 3C:
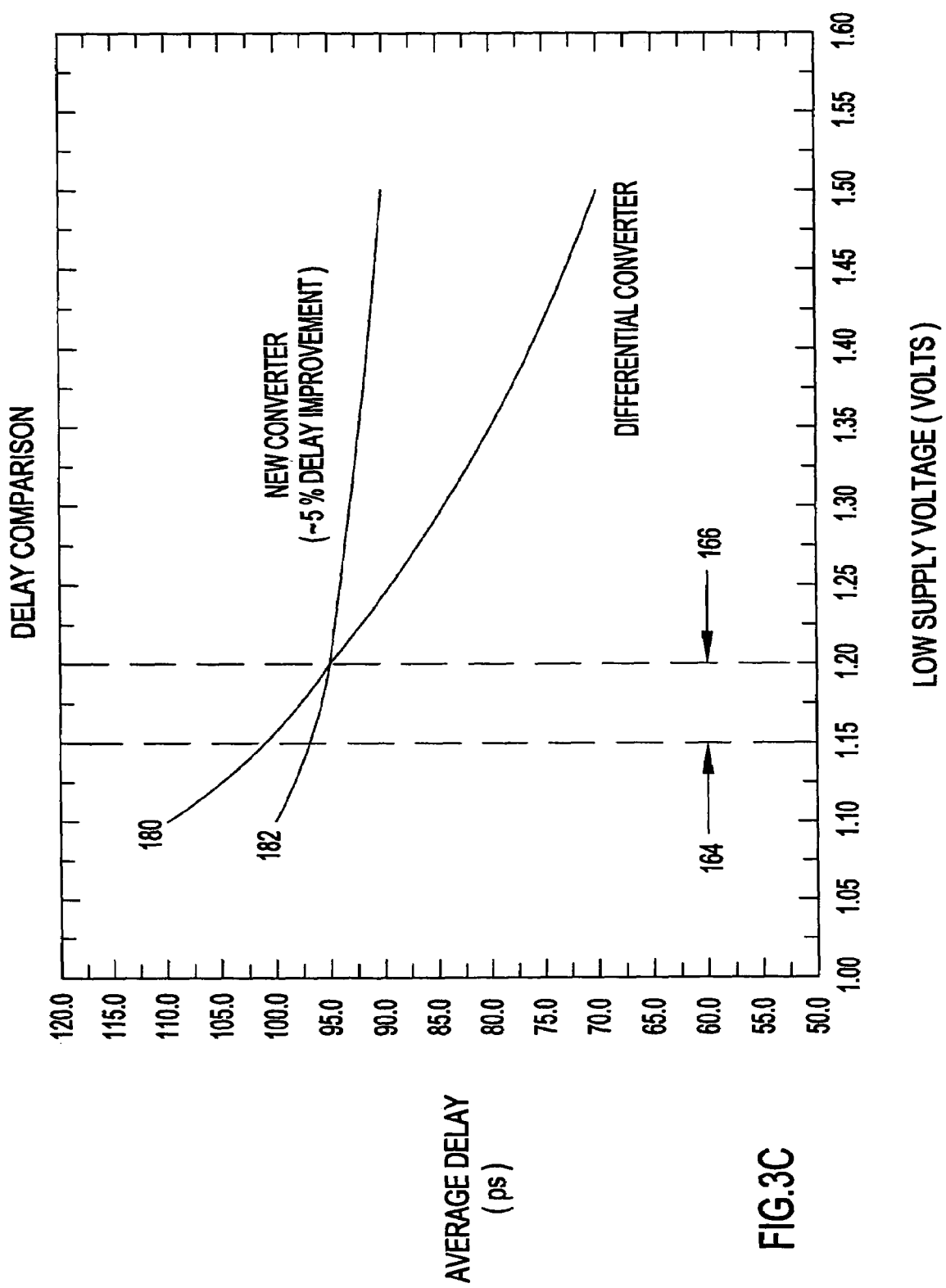

FIGS. 3A–C show comparisons of performance and power simulation results for a preferred embodiment inverters, e.g., 100 in FIG. 1A, compared to a prior art multiple supply, differential level converter (not shown) with both made in the same complementary insulated gate FET technology. For the comparison of this example, low voltage is 1.2V and high voltage is 1.5V; a low voltage inverter (not shown) is driving a 6 femtoFarad (6 fF) load at input 102 and a corresponding input on the prior art level converter; and, each is driving a 50 fF load. The power verses supply comparison of FIG. 3A shows that the prior art level converter (curve 160) uses almost twice as much power as the preferred embodiment level converter (curve 162) in low voltage operation range, indicated by vertical limits 164, 166 at 1.15V and 1.2 V, respectively. It should be noted that since the lower the low voltage supply, the more the power reduction; the better the level converter performs at lower voltage, the more advantage that is realized by that level converter. So, it is inconsequential that the prior art level converter (160) delay improves as the low supply voltage level increases towards the high supply level (1.5), since the necessity for a level converter diminishes as the two voltages converge, i.e., there is no need for level converters when the supply voltages are the same.

Thus, as can further be seen from the example of FIG. 3A, even more power is realized below the selected operating range 164, 166. Additionally, from the leakage power to supply voltage comparison of FIG. 3B, the prior art level converter (curve 170) leaks almost half again as much power as the preferred embodiment level converter (curve 172) in the same low voltage operation range. Furthermore, from the delay versus supply voltage comparison of FIG. 3C, the prior art level converter (curve 180) is slower (more than 5% across the entire range 164, 166) than the preferred embodiment level converter (curve 182) in the same low voltage operation range, which exhibits a much more uniform delay overall. Thus, in addition to being much more flexible and allowing easy placement anywhere in any group of circuits, a preferred embodiment level converter has improved delay, total power, and leakage power over prior art level detectors.

Figure 4:
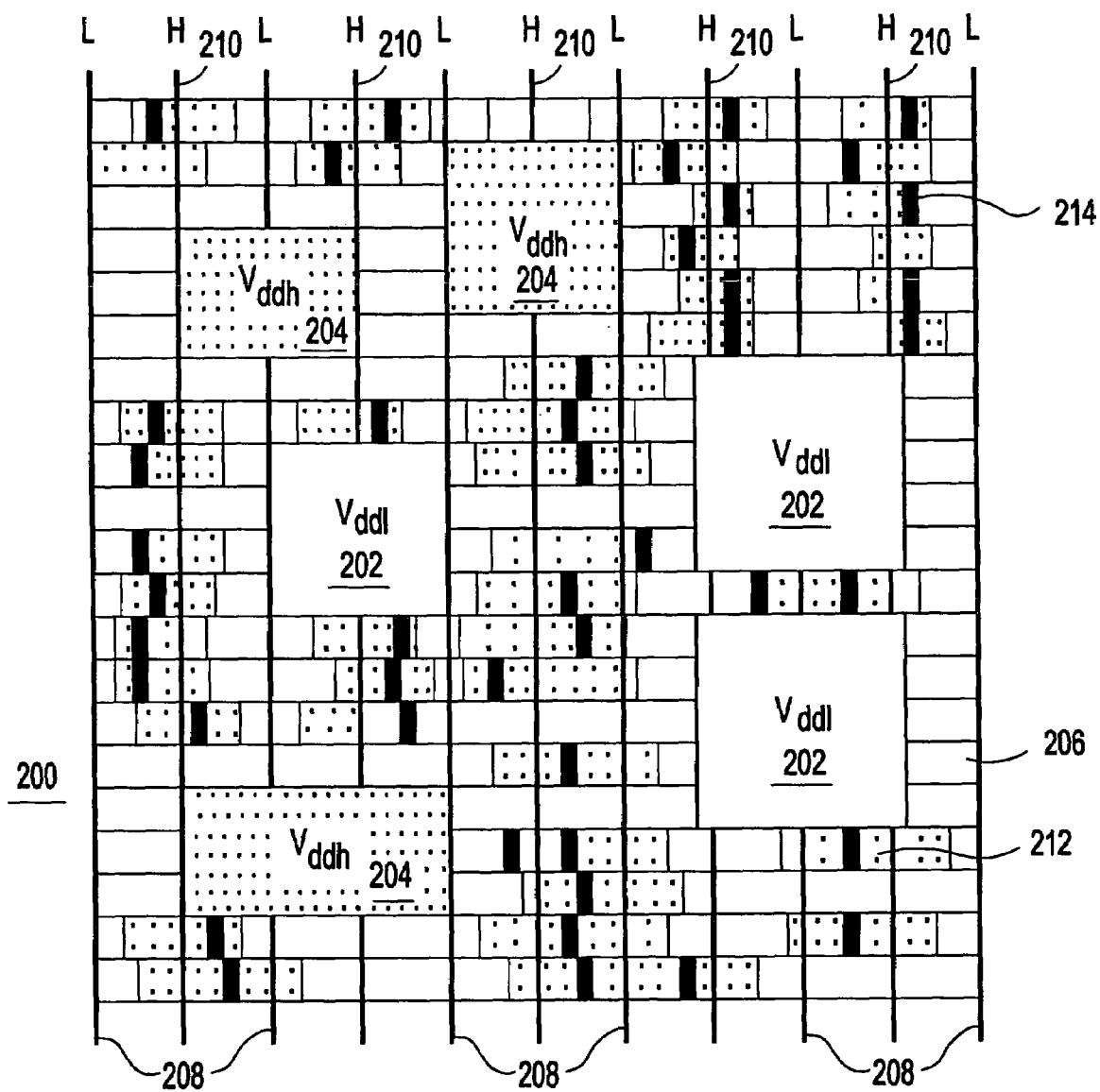
FIG. 4 shows an example of a generic voltage island structure formed according to a preferred embodiment of the present invention.

FIG. 4 shows an example of a generic voltage island structure 200 formed using preferred embodiment level converters, wherein different voltages are assigned at both macro and cell levels. Such voltage assignment flexibility affords more freedom in terms of layout style by allowing multiple voltage islands within the same circuit row. Further, such a pattern 200 is achievable with minimum disturbance to an existing placement, i.e., after normal chip design and placement. So, after designing and placing circuits for performance, for example, the design may be modified, selectively replacing higher power ($V_{ddh}$) circuits (stippled) with lower power ($V_{ddl}$) circuits (clear) where possible, e.g., as described in U.S. application Ser. No. 10/720,464 entitled "MULTIPLE VOLTAGE INTEGRATED CIRCUIT AND DESIGN METHOD THEREFOR" to Anthony Correale Jr. et al. (Correale I) and/or U.S. application Ser. No. 10/720, 562 entitled "METHOD AND PROGRAM PRODUCT OF LEVEL CONVERTER OPTIMIZATION" to Anthony Correale Jr. et al. (Correale II), both filed coincident herewith, assigned to the assignee of the present invention and incorporated herein by reference. Since some gap may be needed between adjacent $V_{ddl}$ islands 202 and $V_{ddh}$ islands 204 (depending on the standard cell library), a minimum or maximum allowed cluster size or number of voltage islands may be specified for each circuit row, e.g., 206, based on the particular user or technology specification. See, for example, U.S. application Ser. No. 10/387,728 entitled "VOLTAGE ISLAND CIRCUIT PLACEMENT" to Anthony Correale Jr., filed Mar. 13, 2003, assigned to the assignee of the present invention and incorporated herein by reference. To facilitate power routing, a power grid structure of VDDL 208 and VDDH 210 is co-designed with the voltage island assignment. Preferred embodiment level converters 212 are placed where needed, e.g., in a higher voltage island 204 or with high voltage logic 214.

Thus, preferred embodiment level converters facilitate a very flexible fine grained dual supply routing topology that significantly reduces perturbation of the low and high voltage gate placement. The supply lines 208, 210 run every 100 tracks are for low and high voltage supplies, respectively. Although in this example, supply lines 208, 210 are assigned alternatively low and high voltage, it is understood that any suitable sequence and spacing may be selected for the particular constraints imposed by the placement of high and low voltages gates. Also, although as is shown in this example, each of the supply lines 208, 210 run the entire length of the row or track, individual lines of one supply voltage, e.g., the low supply, can inhabit partial tracks, with the remaining part of the track being assigned to the other, i.e., the high supply. Each of these vertical supply lines 208, 210 connect to horizontal supply voltage wires at the next lower wiring layer which, in turn supply circuit rows and islands. Thus, the flexible and fine grained nature of this power routing topology makes it significantly easier to cluster high and low voltage cells without disturbing to the current placement or other cells.

Figure 5:
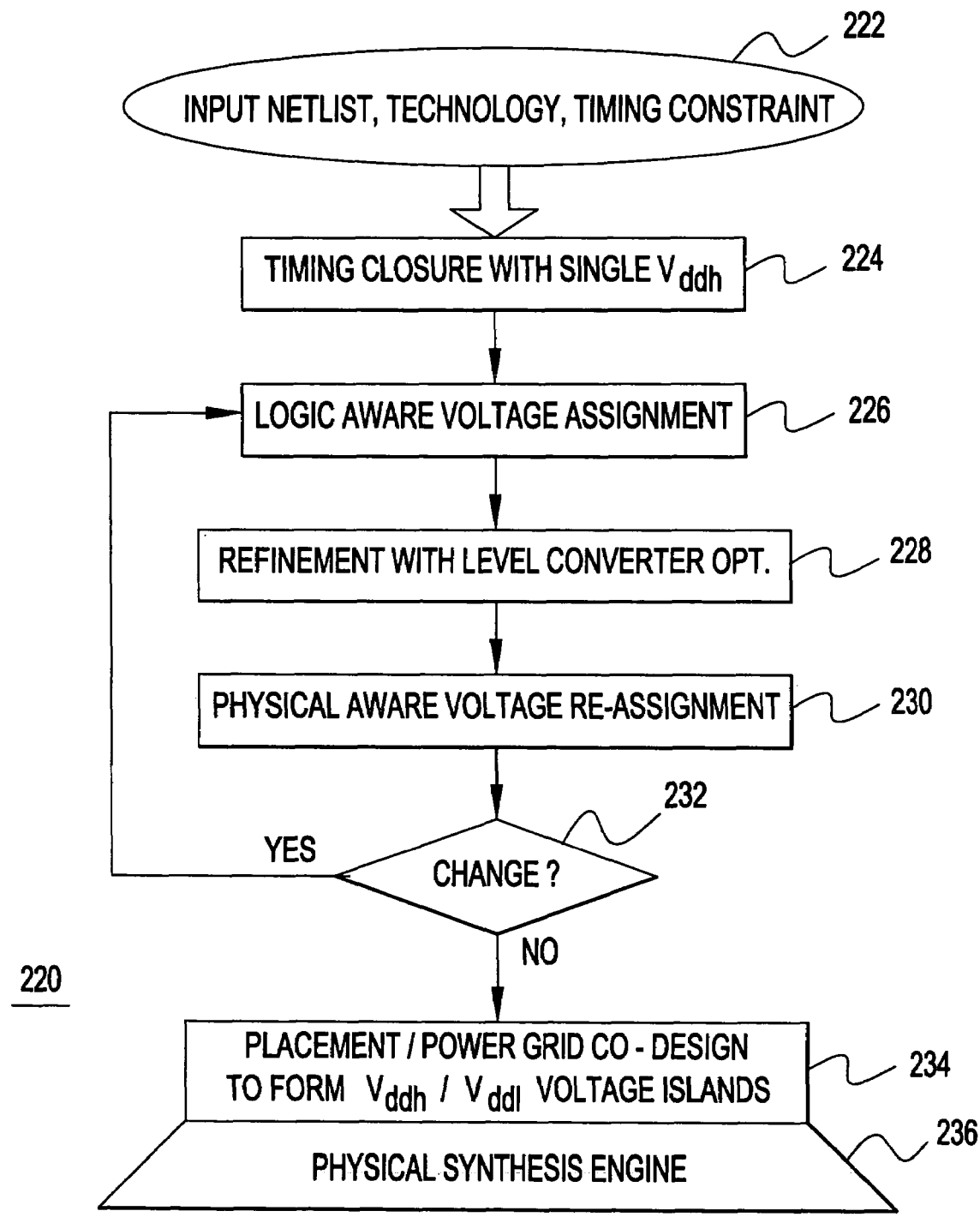
FIG. 5 shows an example of a flowchart of a method of generic voltage island optimization for low power with rapid timing closure according to a preferred embodiment of the present invention.

FIG. 5 shows an example of a flowchart 220 of a method of generic voltage island optimization for low power with rapid timing closure using preferred embodiment level converters, e.g., 100 of FIG. 1A, as described in further detail by Correale I and II. Beginning in step 222 an input netlist description and specifications (e.g., technology files and timing constraints) is provided. In step 224 a timing closure tool with Spice RC delays (e.g., a suitable tool from Synopsis, Inc., or EinsTimer from IBM Corporation) is used to determine the entire circuit/chip timing at the higher supply voltage ($V_{ddh}$) for a base placement and optimization, i.e., determining global placement and obtaining a good timing estimation. Then, non-critical cells are identified and assigned a lower supply voltage ($V_{ddl}$). As noted hereinabove, interconnect delay can dominate the gate delay for deep submicron circuits and so, power can be reduced for lightly loaded circuits where power is not needed for driving large interconnect loads. So, the global placement information is used to correctly identify the critical versus non-critical cells, e.g., heavily loaded verses lightly loaded. Then, in step 226 a logic aware voltage assignment is performed, assigning the lower supply voltage(s) to less critical circuits, i.e., macro, latch and/or cell. Next, in step 228 preferred embodiment level converters are inserted and the results are refined and optimized. In step 230 isolated assignments are removed in a physical aware voltage reassignment step, e.g., replacing high voltage supply cells with level converters at multiple inputs with equivalent low voltage cells or equivalent function level converters such as NAND/AND gate 140 of FIG. 2. Since the physical aware voltage reassignment may create opportunities to reassign previously assigned high voltage cells to low voltage cells, in step 232 the design is checked for such opportunities. If any are found, returning to step 226 for another pass the design is further optimized, until there is no improvement available in step 232. Finally, in step 234 placement and power routing patterns are effected based on the voltage island assignments to form the final high and low voltage islands. As result, the entire flow can be tightly integrated with a suitable physical synthesis engine 236, such as a routing tool from Cadence Design Systems, e.g., for application of any necessary further timing optimization.

Advantageously, preferred embodiment level converters avoid voltage island patterns unnaturally constrained voltage assignment and/or reduced placement flexibility in typical prior art designs. In particular for a typical modern ASIC/SOC design, wherein non-critical regions are interspersed with critical regions in the same circuit row, preferred embodiment level converters can be placed with critical regions, while less critical regions may be converted to more efficient, lower power supply (and lower power dissipation) cells. Further, such placement may be done even when, otherwise, such circuit structures would not be flexible enough to allow circuit placement or voltage island granularity sufficient to meet stringent delay constraints or, in placing to meet such constraints introduce routing problems. It is further Advantageous, therefore, that preferred embodiment level converters facilitate circuit and chip design with generic voltage islands and that have much finer layout granularity. Supply voltage assignment may be done at both macro and gate level, affording designers much more design freedom and providing a much more flexible voltage island layout structure. Further, such a design is achieved without performance degradation.

While the invention has been described in terms of preferred embodiments, those skilled in the art will recognize that the invention can be practiced with modification within the spirit and scope of the appended claims.

What is claimed is:

1. An integrated circuit (IC) comprising:
   a plurality of circuit rows;
   at least one low voltage island in at least one of said plurality of circuit rows, circuit elements in each said at least one low voltage island being powered by a low voltage ($V_{ddl}$) supply; and
   at least one high voltage island in said at least one of said plurality of circuit rows, circuit elements in each said at least one high voltage island being powered by a high voltage ($V_{ddh}$) supply) $V_{ddh}$ being a higher voltage than $V_{ddl}$; and,
   at least one level converter comprising:
   a first buffer receiving an input signal from said at least one low voltage island, said first buffer being connected between a virtual supply and a supply return;
   a second buffer receiving an output of said first buffer and connected between $V_{ddh}$ and said supply return; and
   a supply select between $V_{ddh}$ and said virtual supply, said supply select receiving an output from said second buffer and selectively passing $V_{ddh}$ or a reduced supply voltage to said virtual supply responsive to said output from said second buffer.

2. An IC as in claim 1, wherein said second buffer is an inverter.

3. An IC as in claim 1, wherein said supply select is a supply switch in parallel with at least one diode, both connected between said first supply and said virtual supply.

4. An IC converter as in claim 3, wherein said supply switch is a field effect transistor (FET) gated by said output of said second buffer and said at least one diode is a diode connected FET.

5. An IC as in claim 4, wherein said supply switch FET is a P-type FET (PFET) and said at least one diode connected FET an N-type FET (NFET) diode.

6. An IC as in claim 5, wherein said at least one diode connected NFET is a pair of series connected NFET diodes.

7. An IC as in claim 5, wherein said second buffer is a CMOS inverter.

8. An IC as in claim 7, wherein said first buffer is a CMOS inverter.

9. An IC as in claim 7, wherein said first buffer is a logic gate.

10. An IC as in claim 7, wherein said logic gate is a NAND gate receiving a plurality of $V_{ddl}$ inputs.

11. An IC as in claim 7, wherein said CMOS inverter includes an NFET having a threshold higher than other NFETs in said level converter.

12. An IC as in claim 1, wherein said reduced supply voltage is below $V_{ddl}$.

* * * * *